(12) United States Patent
Tsukahara et al.

(10) Patent No.: US 9,018,035 B2
(45) Date of Patent: Apr. 28, 2015

(54) PRESSED-CONTACT TYPE SEMICONDUCTOR DEVICE AND METHOD FOR MANUFACTURING THE SAME

(71) Applicant: Panasonic Corporation, Osaka (JP)

(72) Inventors: Norihito Tsukahara, Kyoto (JP); Toshiyuki Kojima, Kyoto (JP); Takayuki Hirose, Osaka (JP); Keiko Ikuta, Osaka (JP); Kohichi Tanda, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/823,382

(22) PCT Filed: Oct. 19, 2012

(86) PCT No.: PCT/JP2012/006712
§ 371 (c)(1),
(2) Date: Mar. 14, 2013

(87) PCT Pub. No.: WO2013/105161
PCT Pub. Date: Jul. 18, 2013

(65) Prior Publication Data
US 2014/0110827 A1    Apr. 24, 2014

(51) Int. Cl.
| H01L 21/52 | (2006.01) |
| H01L 29/74 | (2006.01) |
| H01L 23/495 | (2006.01) |
| H01L 23/00 | (2006.01) |
| H01L 23/40 | (2006.01) |

(52) U.S. Cl.
CPC ............. *H01L 23/495* (2013.01); *H01L 24/72* (2013.01); *H01L 2924/13091* (2013.01); *H01L 2924/13055* (2013.01); *H01L 23/4093* (2013.01); *H01L 23/49562* (2013.01); *H01L 23/49582* (2013.01); *H01L 24/89* (2013.01); *H01L 2924/1306* (2013.01); *H01L 24/90* (2013.01)

(58) Field of Classification Search
CPC .............................. H01L 21/563; H01L 23/051
USPC ............................................ 438/98, 123, 727
See application file for complete search history.

(56) References Cited

U.S. PATENT DOCUMENTS

| 5,610,439 A | 3/1997 | Hiyoshi et al. |
| 5,886,324 A * | 3/1999 | Shea .............................. 219/505 |
| 2002/0005578 A1 * | 1/2002 | Kodama et al. ................ 257/727 |

FOREIGN PATENT DOCUMENTS

| JP | 08-088240 A | 4/1996 |
| JP | 11-297929 A | 10/1999 |
| JP | 2005-209784 A | 8/2005 |
| JP | 2008-050673 A | 3/2008 |

* cited by examiner

OTHER PUBLICATIONS

Japanese Search Report for Application No. PCT/JP2012/006712 dated Dec. 18, 2012.

*Primary Examiner* — Brett Feeney
*Assistant Examiner* — Pamela E Perkins
(74) *Attorney, Agent, or Firm* — RatnerPrestia

(57) ABSTRACT

A pressed-contact type semiconductor device includes a power semiconductor element, on an upper surface of which at least a first electrode is formed and on a lower surface of which at least a second electrode is formed, lead frames which face the first electrode and the second electrode of the power semiconductor element respectively, and a clip which applies a pressure to the lead frames while the power semiconductor element is sandwiched by the lead frames, wherein a metallic porous plating part is formed on a surface which faces the first electrode or the second electrode, the surface being a surface of at least one of the lead frames.

8 Claims, 9 Drawing Sheets

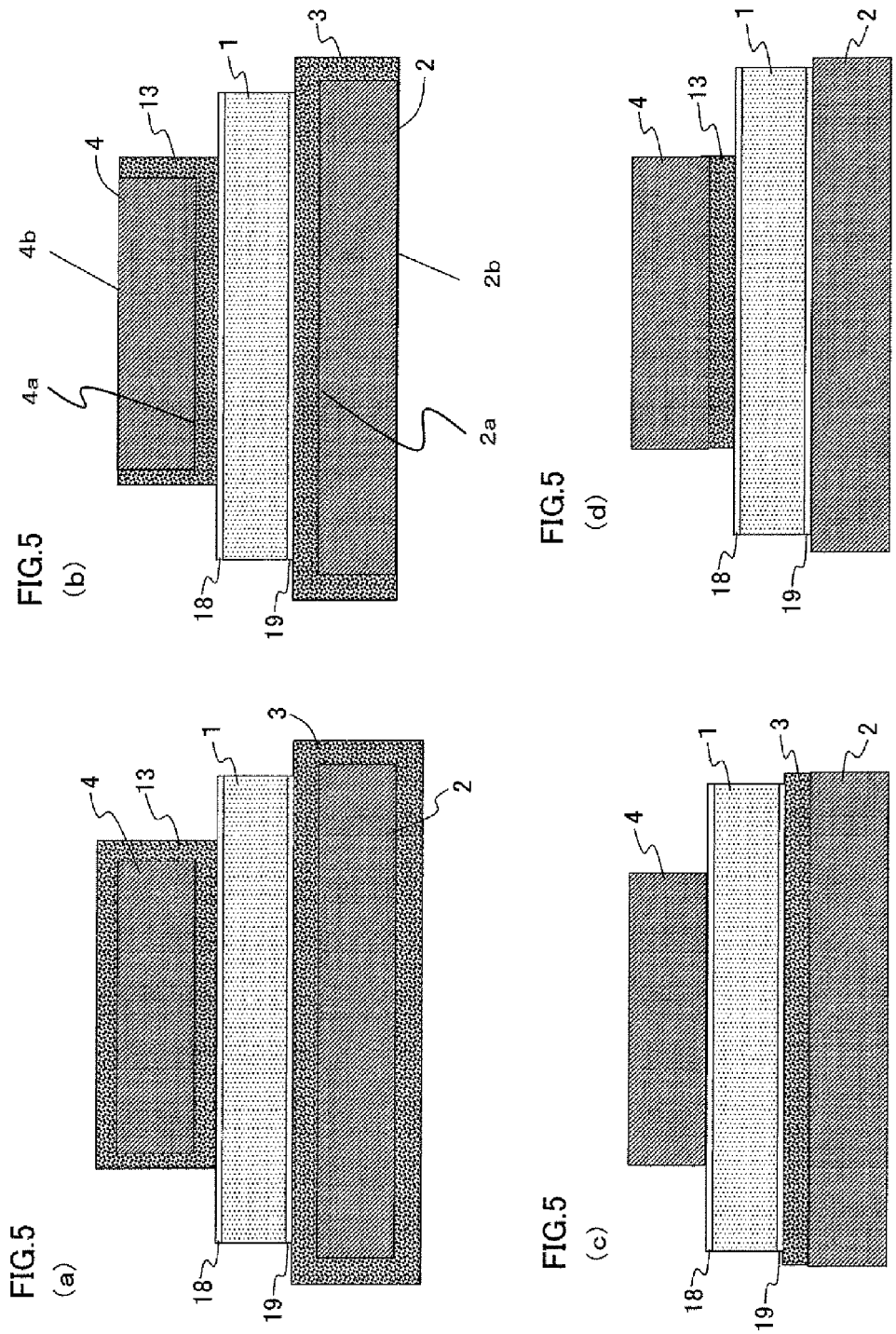

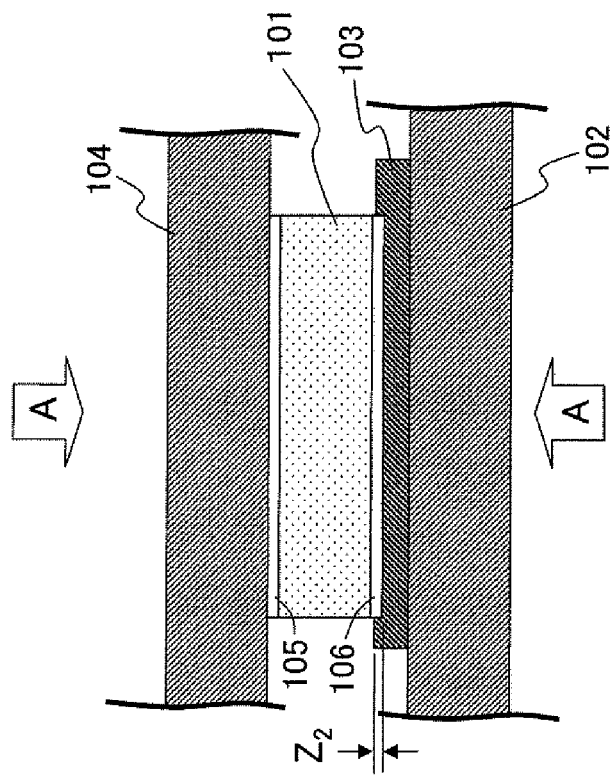
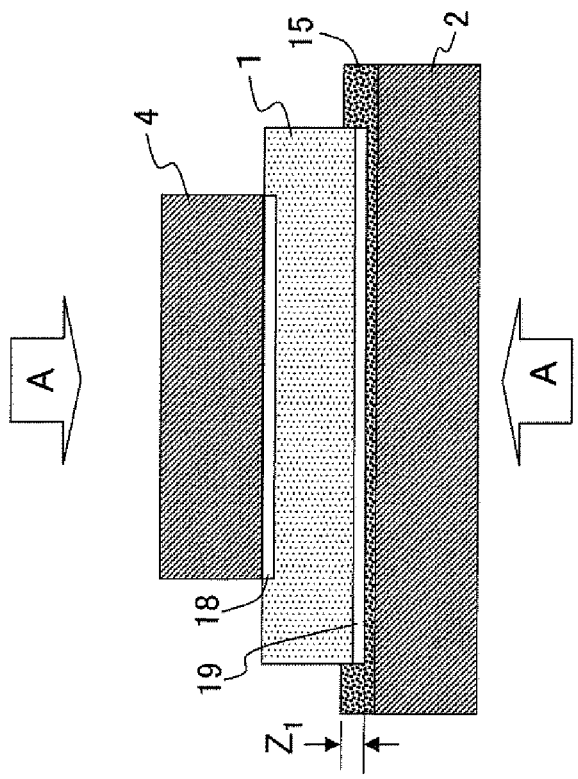

PRESSED-CONTACT TYPE SEMICONDUCTOR DEVICE AND METHOD FOR MANUFACTURING THE SAME

CROSS-REFERENCE TO RELATED APPLICATIONS

This application is a U.S. national phase application of PCT International Patent Application No. PCT/JP2012/006712 filed Oct. 19, 2012, claiming the benefit of priority of Japanese Patent Application No. 2012-002878 filed Jan. 11, 2012, all of which are incorporated by reference herein in their entirety.

TECHNICAL FIELD

The present invention relates to a pressed-contact type semiconductor device and a method for manufacturing the same.

BACKGROUND ART

The power electronics technology which controls the main circuit current by using a power semiconductor element is applied in broad fields such as major appliances, a railroad and an electric vehicle.

In late years, as the power semiconductor element, the element to which more efficient materials such as SiC (Silicon Carbide) or GaN (Gallium Nitride) are applied attracts attention in addition to the IGBT (Insulation Gate type Bipolar Transistor) and the MOSFET (Metal-Oxide-Semiconductor Field-Effect Transistor) which are used conventionally.

Regarding these power semiconductor elements, principally, a gate electrode and an emitter electrode are formed on the upper surface thereof, and a collector electrode is formed on the lower surface thereof.

As the configuration of the power semiconductor device in which the power semiconductor element is included, generally, the configuration in which the power semiconductor element is joined directly to a lead frame (electrode) using a solder is known.

However, in a power semiconductor device of such a configuration, since a coefficient of linear expansion of the lead frame (electrode) and a coefficient of linear expansion of the power semiconductor element are greatly different, large heat stress is applied repeatedly to the solder joining part by a power cycle at the time of making the power semiconductor device drive, finally, a solder crack occurs and a problem of joining failure arises.

Recently, in order to cope with such a problem to meet the requirement of the securing of reliability for the power cycle at high temperature, a pressed-contact type semiconductor device has attracted attention, which realizes an electrical contact by performing a direct surface contact without the solder between the lead frame (electrode) and each one of the gate electrode and the emitter electrode, which are formed on the upper surface of the power semiconductor element, and the collector electrode, which is formed on the lower surface of the power semiconductor element, and always applying pressure.

When this pressed-contact type power semiconductor device is used, the heat stress at the time of the power cycle occurs on a connection boundary surface between the electrode of the power semiconductor element and the lead frame (electrode). However, since the connection part is not a metallic fixed connection such as the solder joining but a contact connection, the connection boundary surface thereby slides, the heat stress is eased and it is possible to prevent the connection part from breaking down, and then it becomes possible to realize a connection with high reliability.

However, in the case of such a pressed-contact type power semiconductor device, it is difficult to realize a surface contact between the electrode of the semiconductor element and the lead frame (electrode) with uniform pressure, due to a processing dimensional variation, a curve, and an undulation of various components such as a lead frame (electrode), a heat radiation plate, and the like which constitute the device. As a result, there is a problem that the connection resistance value is not stabilized, and the characteristic of the device becomes unstable.

FIG. 9 is a schematic sectional view showing the problem of such a pressed-contact type power semiconductor device.

FIG. 9 shows, for instance, a case in which a gap K occurs between an upper electrode 105 formed on the upper surface of the power semiconductor element 101 and a lead frame (electrode) 104, and a gap L occurs between a lower electrode 106 formed on the lower surface of the power semiconductor element 101 and a lead frame (electrode) 102 because the thickness of the lead frame (electrode) 102 varies on the electrode plane of the power semiconductor element 101, that is, G>H, and also the thickness of the lead frame (electrode) 104 varies on the electrode plane of the power semiconductor element 101, that is, J>I. As a result, even if the applied pressure A is always applied perpendicularly in the thickness direction of the power semiconductor element 101, the uniform surface contact between the lower electrode 106 of the power semiconductor element 101 and the lead frame (electrode) 102 and between the upper electrode 105 of the power semiconductor element 101 and the lead frame 104 is not realized, and it becomes difficult to obtain a stable connection resistance value.

In the case where the power semiconductor device is constructed by using the components with a general tolerance, there is an example in which gaps K and L of 10 μm or more occur.

A way of coping with such a case by making the processing finished dimensions of the various constitutional components strictly equal could be considered. However, this leads to an increase in the cost of the components, and it is actually difficult to cope with the case by such a way.

For such a problem, as a method for absorbing the processing dimensional variation of various constitutional components, a method of allowing a soft metal sheet made of Ag or the like to be intercalated, as a variation correction plate, between the electrode of the power semiconductor element and the lead frame (electrode) is proposed (see, for example, Japanese Patent Application Laid-open No. H08-88240).

FIG. 10 shows a sectional structure of the joining part of the power semiconductor device in which the soft metal sheet is intercalated between the electrode of the power semiconductor element and the lead frame (electrode).

The lower electrode 106 of the power semiconductor element 101 such that at least the upper electrode 105 is formed on the upper surface thereof and the lower electrode 106 is formed on the lower surface thereof is, with the applied pressure A being always applied, electrically connected with the lead frame (electrode) 102 via the soft metal sheet 103, which is disposed between the lower electrode 106 and the lead frame (electrode) 102 facing the lower electrode 106.

Incidentally, in the case of the configuration shown in FIG. 10, the upper electrode 105 which is formed on the upper surface of the power semiconductor element 101 and the lead frame (electrode) 104 are in direct contact with each other, however, the contact configuration, in which the soft metal sheet 103 is intercalated therebetween, can be utilized.

The soft metal sheet 103 shown in FIG. 10 plays the role in correcting the gap which occurs between the lower electrode 106 of the power semiconductor element 101 and the lead frame (electrode) 102 due to the variation of the components, because the soft metal sheet 103 is deformed in the thickness direction when the pressure is applied to it.

SUMMARY OF THE INVENTION

Problems to be Solved by the Invention

However, there is a problem that, even in a case of the above described method of allowing a soft metal sheet to be intercalated, it is impossible to obtain an effect to the extent that the variation of the components can be absorbed and the uniform surface contact can be obtained.

Next, the problem in the conventional configuration where the soft metal sheet is intercalated will be described below.

Generally, the soft metal sheet, which has the thickness of about 100 μm and the size of about 5 μm to 20 μm, is used. In the case of such a soft metal sheet, since the thickness is very thin compared with the area to which the pressure is applied, the quantity of deformation in the thickness direction is very slight when the pressure is applied within the range where the power semiconductor element is not broken down.

FIG. 11 shows a correlation between the applied pressure A and the connection resistance value between the lower electrode 106 of the power semiconductor element 101 and the lead frame 102, and a correlation between the applied pressure A and the quantity of deformation in the thickness direction of the soft metal sheet 103, with respect to the conventional pressed-contact type power semiconductor device in the configuration of FIG. 10.

When the applied pressure A is made to increase to 10 MPa, the connection resistance value tends to be stabilized in a pressure range from 6.5 MPa to 10 MPa. However, in a case of the applied pressure of 7 MPa or more, the power semiconductor element 101 tends to be broken down. Since the stability region of the connection resistance value which can be practically used as a product is restricted to the neighborhood of 6.5 MPa, the margin of the condition, where the stable joining can be obtained, is narrow.

On the other hand, the quantity of deformation in the thickness direction of the soft metal sheet 103 tends to increase with the increase in pressure, however, the quantity of deformation is about 6 μm and small even in the neighborhood of the breaking down pressure 7 MPa of the power semiconductor element 101. As a result, the effect of absorbing the variation of the components to obtain the uniform surface contact is small, and the small quantity of deformation in the thickness direction of the soft metal sheet 103 has been a factor of the narrow margin of the condition where the stable joining can be obtained.

In view of the above-mentioned problem, an aspect of the present invention is to provide a pressed-contact type semiconductor device and a method for manufacturing the same, which can absorb the dimensional variation of the various components, which constitute the pressed-contact type semiconductor device, and can obtain the stable connection resistance value with a pressure that is smaller as compared with the conventional pressed-contact type semiconductor device.

SUMMARY OF THE INVENTION

To solve the above problem, the $1^{st}$ aspect of the present invention is a method for manufacturing a pressed-contact type semiconductor device which has a semiconductor element, on an upper surface of which at least a first electrode is formed and on a lower surface of which at least a second electrode is formed, and a pair of lead frame members which face the first electrode and the second electrode of the semiconductor element respectively comprising:

forming a metallic porous plating layer on a surface of at least one of the lead frame members, the surface being to face the first electrode or the second electrode of the semiconductor element; and joining the metallic porous plating layer to the first electrode or the second electrode of the semiconductor element by a pressed contact, the first electrode or the second electrode being made to face the metallic porous plating layer.

The $2^{nd}$ aspect of the present invention is the method for manufacturing a pressed-contact type semiconductor device according to the $1^{st}$ aspect of the present invention, wherein a pore of the metallic porous plating layer has a shape in which a length in a pressed-contact direction is longer than a length in a direction that is perpendicular to the pressed-contact direction.

The $3^{rd}$ aspect of the present invention is the method for manufacturing a pressed-contact type semiconductor device according to the $1^{st}$ aspect of the present invention, wherein a thickness of the metallic porous plating layer is 10 μm or more and 200 μm or less and a porosity of the metallic porous plating layer is 20% or more and 70% or less.

The $4^{th}$ aspect of the present invention is a pressed-contact type semiconductor device comprising:

a semiconductor element, on an upper surface of which at least a first electrode is formed and on a lower surface of which at least a second electrode is formed;

a pair of lead frame members which face the first electrode and the second electrode of the semiconductor element respectively; and a pressure applying member which applies a pressure to the pair of lead frame members while the semiconductor element is sandwiched by the pair of lead frame members, wherein a metallic porous plating part is formed on a surface which faces the first electrode or the second electrode, the surface being a surface of at least one of the lead frame members.

The $5^{th}$ aspect of the present invention is the pressed-contact type semiconductor device according to the $4^{th}$ aspect of the present invention, wherein the pressure which is applied by the pressure applying member is less than a pressure which changes the metallic porous plating part into a plastic region from an elastic region.

The $6^{th}$ aspect of the present invention is the pressed-contact type semiconductor device according to the $4^{th}$ aspect of the present invention, wherein the pressure which is applied by the pressure applying member is less than a pressure which destroys the semiconductor element.

The $7^{th}$ aspect of the present invention is the pressed-contact type semiconductor device according to the $4^{th}$ aspect of the present invention, wherein the metallic porous plating part is formed by a nickel porous plating.

The $8^{th}$ aspect of the present invention is the method for manufacturing a pressed-contact type semiconductor device according to the $2^{nd}$ aspect of the present invention, wherein a thickness of the metallic porous plating layer is 10 μm or more and 200 μm or less and a porosity of the metallic porous plating layer is 20% or more and 70% or less.

Advantageous Effects of Invention

The present invention can provide a semiconductor device and a method for manufacturing the same, which can absorb the dimensional variation of the various components, which constitute the pressed-contact type semiconductor device, and can obtain the stable connection resistance value with a pressure that is smaller as compared with the conventional pressed-contact type semiconductor device.

BRIEF DESCRIPTION OF THE DRAWINGS

FIGS. 5(a) to 5(d) are schematic sectional views showing configurations of other pressed-contact type power semiconductor devices according to the embodiment of the present invention;

FIG. 7(a) is a schematic sectional view of a pressed-contact type power semiconductor device according to an example of the present invention;

FIG. 7(b) is a schematic sectional view of a pressed-contact type power semiconductor device as comparative example;

PREFERRED EMBODIMENTS OF THE INVENTION

Hereinafter, an embodiment according to a pressed-contact type semiconductor device of the present invention is described with reference to the drawings, and an embodiment according to a method for manufacturing a pressed-contact type semiconductor device of the present invention is also described.

(Embodiment)

Figure 1:
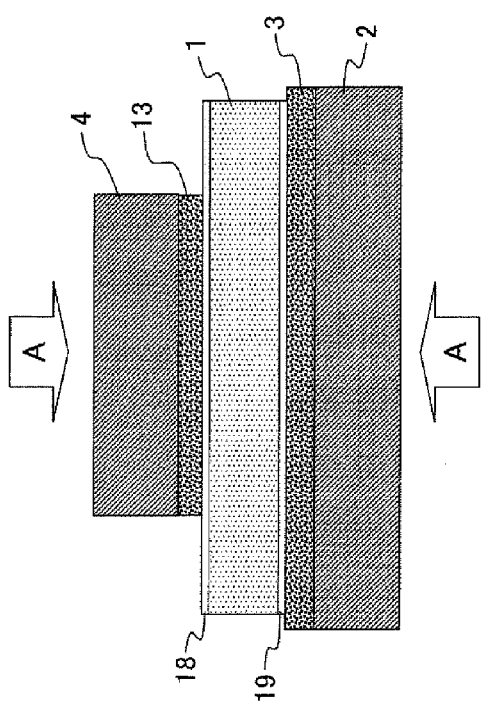
FIG. 1 is a schematic sectional view showing a configuration of a pressed-contact type power semiconductor device according to an embodiment of the present invention.

FIG. 1 is a schematic sectional view showing a configuration of the pressed-contact type power semiconductor device according to an embodiment of the present invention.

As shown in FIG. 1, a lead frame 4 with a metallic porous plating layer 13 formed on the lower surface thereof is disposed over an upper electrode 18 of a power semiconductor element 1, and a lead frame 2 with a metallic porous plating layer 3 formed on the upper surface thereof is disposed under a lower electrode 19 of the power semiconductor element 1. A pressed-contact joining is carried out by always applying an applied pressure A with the orientations facing each other with respect to the lead frame 2 and the lead frame 4. And then, the electrical continuity between the upper electrode 18 of the power semiconductor element 1 and the lead frame 4, and the electrical continuity between the lower electrode 19 of the power semiconductor element 1 and the lead frame 2 are obtained.

By the way, the upper electrode 18 corresponds to one example of a first electrode of the present invention, and the lower electrode 19 corresponds to one example of a second electrode of the present invention. Further, the lead frame 2 corresponds to one example of one lead frame member of a pair of lead frame members of the present invention, and the lead frame 4 corresponds to one example of the other lead frame member of a pair of lead frame members of the present invention.

The upper electrode 18 and lower electrode 19 of the power semiconductor element 1 are in contact with the lead frames 4 and 2 through the metallic porous plating layers 13 and 3 respectively. The pressed-contact state is maintained by always applying the applied pressure A in the state of the semiconductor device through a heat radiation plate, a housing, and the like (see FIG. 6), which are not shown in FIG. 1.

Figure 2:
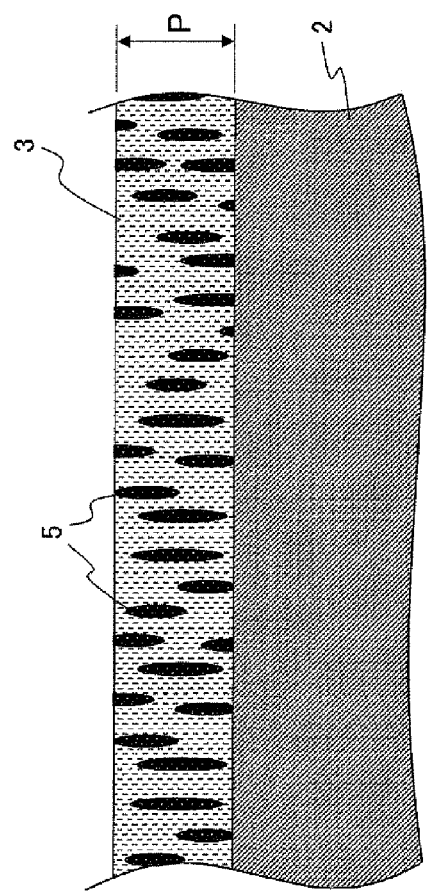
FIG. 2 is a schematic sectional view of a metallic porous plating layer which has been formed on a lead frame according to the embodiment of the present invention.

FIG. 2 is an enlarged schematic sectional view of the metallic porous plating layer 3 which has been formed on the lead frame 2.

By the way, the portion of the metallic porous plating layer 13 which is formed on the lead frame 4 also has the same configuration as the portion of the metallic porous plating layer 3 has. Here, the portion of the metallic porous plating layer 3 is explained, however, the explanation here can be applied to the portion of the metallic porous plating layer 13 similarly.

It is desirable that the thickness P of the metallic porous plating layer 3 be formed between 10 μm or more and 200 μm or less, when the absorbency of the dimensional variation of the various components and the productivity of the plating step of the power semiconductor device are taken into consideration.

Figure 9:
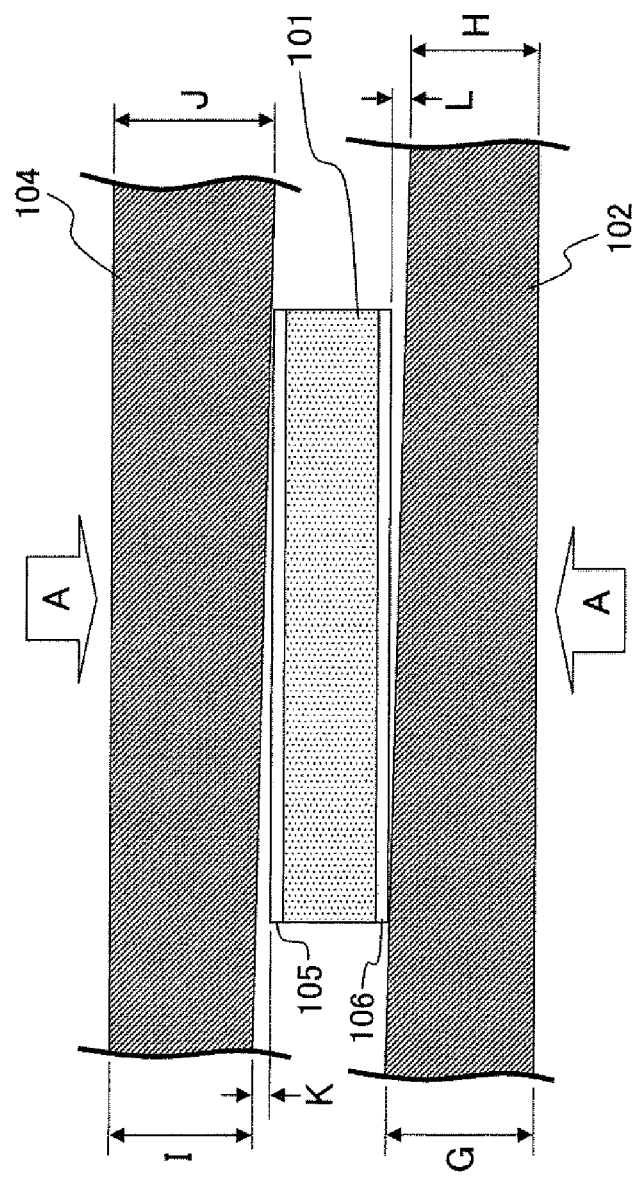
FIG. 9 is a schematic sectional view showing the problem of the conventional pressed-contact type power semiconductor device.

As shown in FIG. 9, in the case where the power semiconductor device is constructed by using the components with a general tolerance, the gaps K and L of 10 μm or more occur between the power semiconductor element 101 and the lead frame 104 and between the power semiconductor element 101 and the lead frame 102. When such an occurrence of the gaps is taken into consideration, in case the thickness P of the metallic porous plating layer 3 is smaller than 10 μm, the effect of the absorption of the gaps K and L is small, and it is difficult to obtain the uniform pressed-contact force in a surface.

Further, it is not desirable to make the thickness P of the metallic porous plating layer 3 larger than 200 μm because the productivity falls due to the protraction of plating time and the heat thermal resistance of the porous plating layer increases.

In the metallic porous plating layer 3, needlelike pores 5 which are lengthwise in the thickness direction (pressed-contact direction) are formed with a porosity between 20% or more and 70% or less.

When the porosity of the metallic porous plating layer 3 is smaller than 20%, a deviation occurs in the number of pores per unit volume, and the lengthwise and needlelike pore 5 cannot be obtained with a uniform porosity.

When the porosity is larger than 70%, the pore 5 is formed with a distorted shape so that the adjacent pores overlap each other, and the orderly, lengthwise and needlelike form can not be obtained.

As mentioned above, it is desirable that the porosity of the lengthwise and needlelike pore 5 in the metallic porous plating layer 3 be 20% or more and 70% or less.

Figure 3:
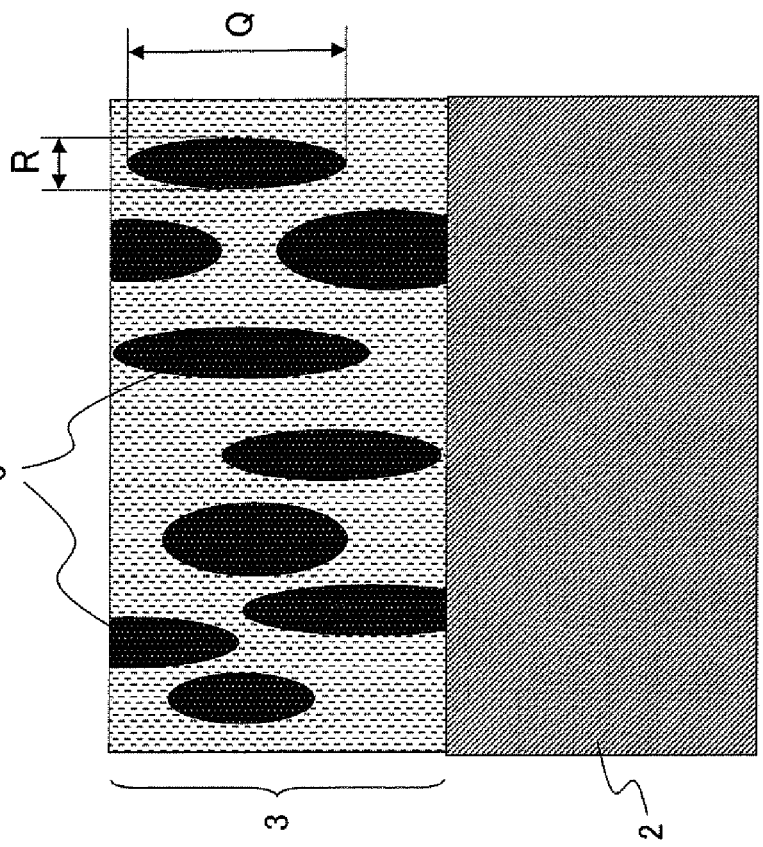
FIG. 3 is a schematic sectional view of a metallic porous plating layer for explaining the shape of the pore, according to the embodiment of the present invention.

FIG. 3 is an enlarged sectional view of a metallic porous plating layer for explaining the shape of the pore 5.

The pore 5 has a needlelike-shape or a long ellipsoid shape in which a length Q in the thickness direction, that is, the pressed-contact direction is larger than a length R in the direction perpendicular to the pressed-contact direction. Since the pore 5 has such a shape, it becomes easy for the metallic porous plating layer 3 to be deformed in the thickness direction by smaller pressure compared with the conventional pressed-contact type semiconductor device, and an effect of allowing the quantity of deformation in the thickness direction to become larger arises. Further, the metallic porous plating layer 3 can maintain the elastic deformation state after deformation, because of the porous structure.

Figure 4:
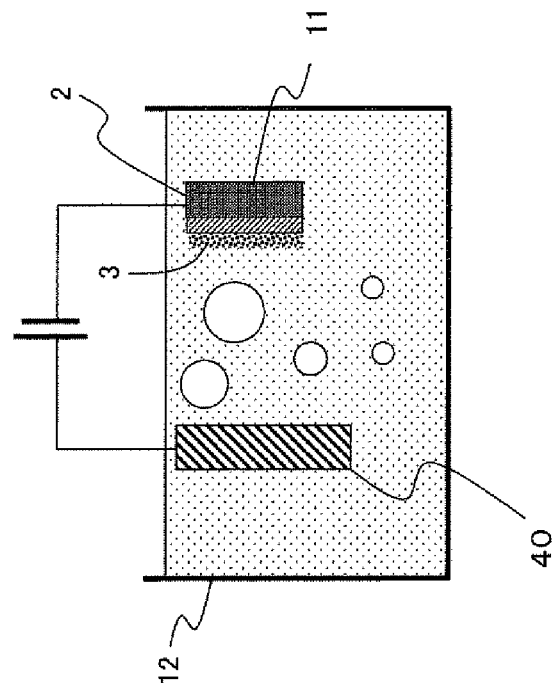
FIG. 4 is a schematic view showing a forming step of the metallic porous plating layer according to the embodiment of the present invention.

FIG. 4 is a schematic view showing a forming step of the metallic porous plating layer 3 on the lead frame 2.

For example, the metallic porous plating layer 3 is obtained by soaking the lead frame 2 and a metal plate 40 for plating in a plating tank 12 in which the foaming agent is put, and applying electroplating to it.

In FIG. 4, a mask 11 is attached to the lead frame 2, and the metallic porous plating layer 3 is applied selectively only to the surface on the side that comes in contact with the lower electrode 19 of the power semiconductor element 1. At this time, the thickness and porosity (size of the pore) of the metallic porous plating layer 3 can be controlled by adjusting the electric current density allowed to pass through the lead frame 2, and the plating time.

By the way, the surface of the lead frame 2 on the side that comes in contact with the lower electrode 19 of the power semiconductor element 1, to which the metallic porous plating layer 3 is applied in FIG. 4, corresponds to one example of "a surface of at least one of the lead frame members, the surface being to face the first electrode or the second electrode" of the present invention. In FIG. 4, the metallic porous plating layer 3 which is applied to the lead frame 2 corresponds to one example of a metallic porous plating layer of the present invention. In FIG. 4, the step in which the metallic porous plating layer 3 is applied to the lead frame 2 corresponds to one example of a plating step of the present invention.

Incidentally, copper is used in general as a material of the lead frame 2, however, aluminum or nickel also can be used.

Generally, nickel is used as a metal of which the porous plating layer 3 is made, however, the metal is not limited to this. For instance, copper and tin also can be used as the metal of which the porous plating layer 3 is made.

FIGS. 5(a) to 5(d) are schematic sectional views showing configurations of other pressed-contact type power semiconductor devices according to the present embodiment.

Regarding each of the pressed-contact type power semiconductor devices shown in FIGS. 5(a) to 5(d), the portions of the lead frames 2 and 4, on which the metallic porous plating layers 3 and 13 are formed respectively, are different from those of the pressed-contact type semiconductor device shown in FIG. 1.

The metallic porous plating layers 3 and 13 may be formed all over the surface with respect to each surface of the lead frames 2 and 4 as shown in FIG. 5(a), and may not be formed on the surfaces 2b and 4b of the lead frames 2 and 4 on the opposite sides with reference to the surfaces 2a and 4a of the lead frames 2 and 4 on the sides which face the upper electrode 18 and the lower electrode 19 of the power semiconductor element 1 as shown in FIG. 5(b). That is, they can be formed at least on the surfaces on the sides which face the upper electrode 18 and the lower electrode 19 of the power semiconductor element 1. For example, the metallic porous plating layers 3 and 13 may be formed all over the surface, except for the surfaces 2b and 4b of each surface of the lead frames 2 and 4.

As shown in FIGS. 5(c) and 5(d), the configuration can be utilized in which the metallic porous plating layer 13 and 3 are formed only on any one of the lead frame 4 which comes in contact with the upper electrode 18 of the power semiconductor element 1 and the lead frame 2 which comes in contact with the lower electrode 19 of the power semiconductor element 1.

Figure 10:
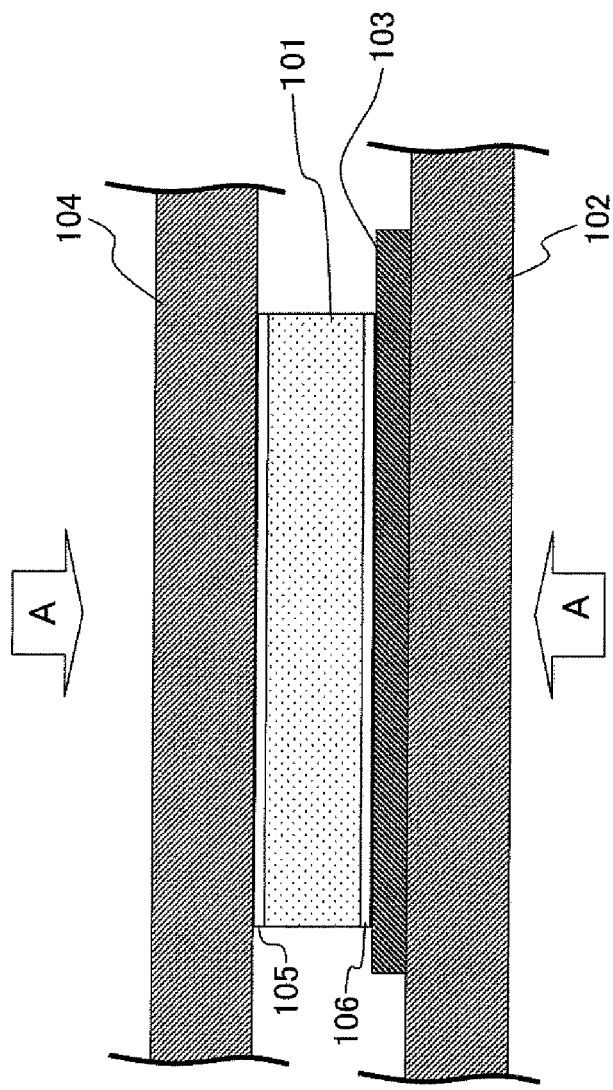
FIG. 10 is a schematic sectional view of the conventional pressed-contact type power semiconductor device in which the soft metal sheet is intercalated between the electrode and the lead frame (electrode) of the power semiconductor element.

In the case of the metallic porous plating layers 13 and 3 of the present embodiment, since larger deformation is obtained in the pressed-contact direction by applying smaller pressure as compared with the case of the conventional soft metal sheet 103 shown in FIG. 10, the thickness variation, curve, and undulation of the components such as the lead frame 4, the lead frame 2 and the like, which constitute the pressed-contact type power semiconductor device, can be absorbed effectively and the stable connection resistance value can be obtained.

Figure 6:
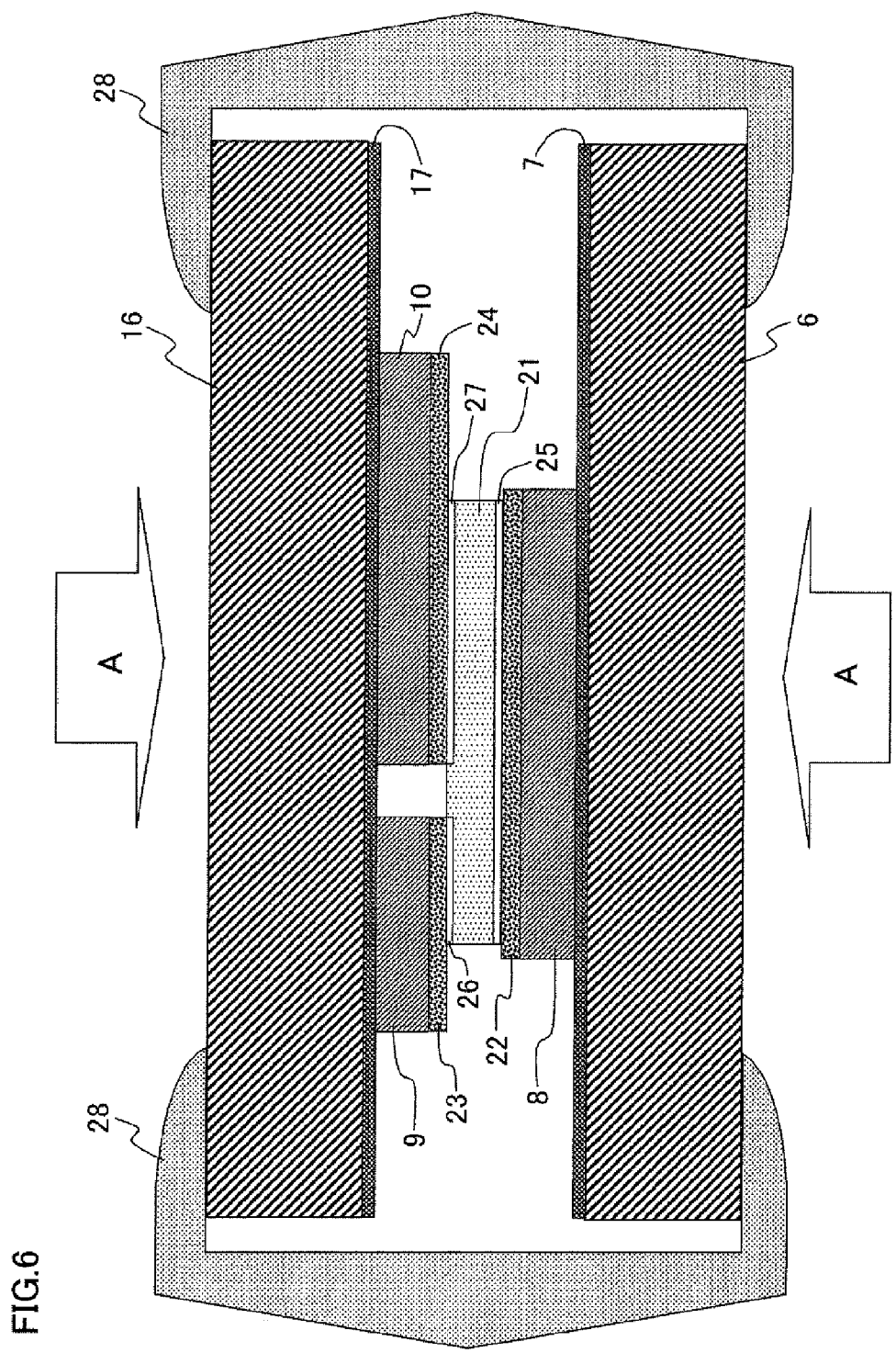
FIG. 6 is a schematic sectional view of a pressed-contact type power semiconductor device according to an embodiment of the present invention.

Next, as a typical example of the pressed-contact type power semiconductor device, shown in FIG. 6 is a schematic sectional view of a pressed-contact type power semiconductor device with the configuration of the present embodiment being applied to a power semiconductor element of a vertical power MOSFET that has two electrodes on the upper surface as an emitter and a gate and a source electrode on the lower surface.

In FIG. 6, reference numerals 6 and 16 denote heat radiation plates made of aluminum. The heat radiation plate 6 or 16 has a role in holding a lead frame 8, a lead frame 9 and a lead frame 10 by pressed contact, a role in radiating heat efficiently in generation of heat of a power semiconductor element 21, and a role in maintaining electric insulation.

As the materials for the heat radiation plates 6 and 16, metallic materials such as aluminum, copper and the like, and insulating inorganic materials with good thermal conductivity, specifically, ceramics which consist of aluminum nitride (AlN), silicon nitride ($Si_3N_4$), alumina ($Al_2O_3$), and the like, can be used.

When, as the heat radiation plates 6 and 16, the metallic materials are used, insulating layers 7 and 17 need to be formed on the surfaces which come in contact with the lead frame 8, the lead frame 9 and the lead frame 10 to maintain electric insulation. As the insulating layers 7 and 17, an anodic oxide film of aluminum, a diamond thin film, a film formed by ceramic spraying, diamond-like carbon, etc. can be used.

On the heat radiation plate 6, the lead frame 8 on which a metallic porous plating layer 22 has been formed, a power semiconductor element 21, the lead frame 9 on which a metallic porous plating layer 23 has been formed, the lead frame 10 on which a metallic porous plating layer 24 has been formed, and the heat radiation plate 16 are disposed in this order with a configuration such that a source electrode 25 on the lower surface of the power semiconductor element 21 comes in contact with the metallic porous plating layer 22, an emitter electrode 26 on the upper surface of the power semiconductor element 21 comes in contact with the metallic porous plating layer 23, and a gate electrode 27 on the upper surface of the power semiconductor element 21 comes in contact with the metallic porous plating layer 24. Then each of the electrodes 25, 26, and 27 of the power semiconductor element 21 and each of the lead frames 8, 9, and 10 which face the electrodes 25, 26, and 27 respectively are joined by pressed contact with the applied pressure A generated by the heat radiation plate 6 and the heat radiation plate 16 that are sandwiched by a pair of the clips 28 and 28.

The applied pressure A is always applied in the state of the semiconductor device, for example, in such a way that the heat radiation plates 6 and 16 are sandwiched by the pair of the clips 28 and 28 as shown in FIG. 6, or fixed with screws.

By the way, the emitter electrode 26 and the gate electrode 27 correspond to one example of a first electrode of the present invention, and the source electrode 25 corresponds to one example of a second electrode of the present invention. The lead frame 8 corresponds to one example of one lead frame member of a pair of lead frame members of the present invention, and the lead frames 9 and 10 correspond to one example of the other lead frame member of a pair of lead frame members of the present invention. The metallic porous plating layers 22, 23 and 24 which are in the pressed-contact state correspond to one example of a metallic porous plating part of the present invention. The pair of the clips 28 and 28 corresponds to one example of a pressure applying member of the present invention. The step in which each of the electrodes 25, 26, and 27 of the power semiconductor element 21 and each of the lead frames 8, 9, and 10 which face the electrodes 25, 26, and 27 respectively are joined by pressed contact by the pair of the clips 28 and 28 corresponds to one example of a pressed-contact joining step of the present invention.

Incidentally, here, a configuration is utilized in which, as a first electrode formed on an upper surface of a power semiconductor element of the present invention, two electrodes, that is, the emitter electrode 26 and the gate electrode 27 are disposed on the upper surface of the power semiconductor element 21. However, the first electrode of the present invention is not limited to two electrodes, and can be one electrode, or a configuration can be utilized in which three or more electrodes are formed.

A configuration is utilized in which, as a second electrode formed on a lower surface of a power semiconductor element of the present invention, only one electrode, that is, the source electrode 25 is disposed on the lower surface of the power semiconductor element 21. However, the second electrode of the present invention is not limited to one electrode, and a configuration can be utilized in which plural electrodes are formed on the lower surface of the power semiconductor element.

As described above, even if utilized is a configuration of the power semiconductor element such that plural electrodes are disposed on one side surface, in which it is more difficult to obtain uniform surface pressure, it becomes possible to absorb the variation of the various components and obtain the uniform surface pressure by forming the metallic porous plating layer on each lead frame, and as a result, it is possible to obtain the stable connection resistance value.

EXAMPLE

Figure 8:
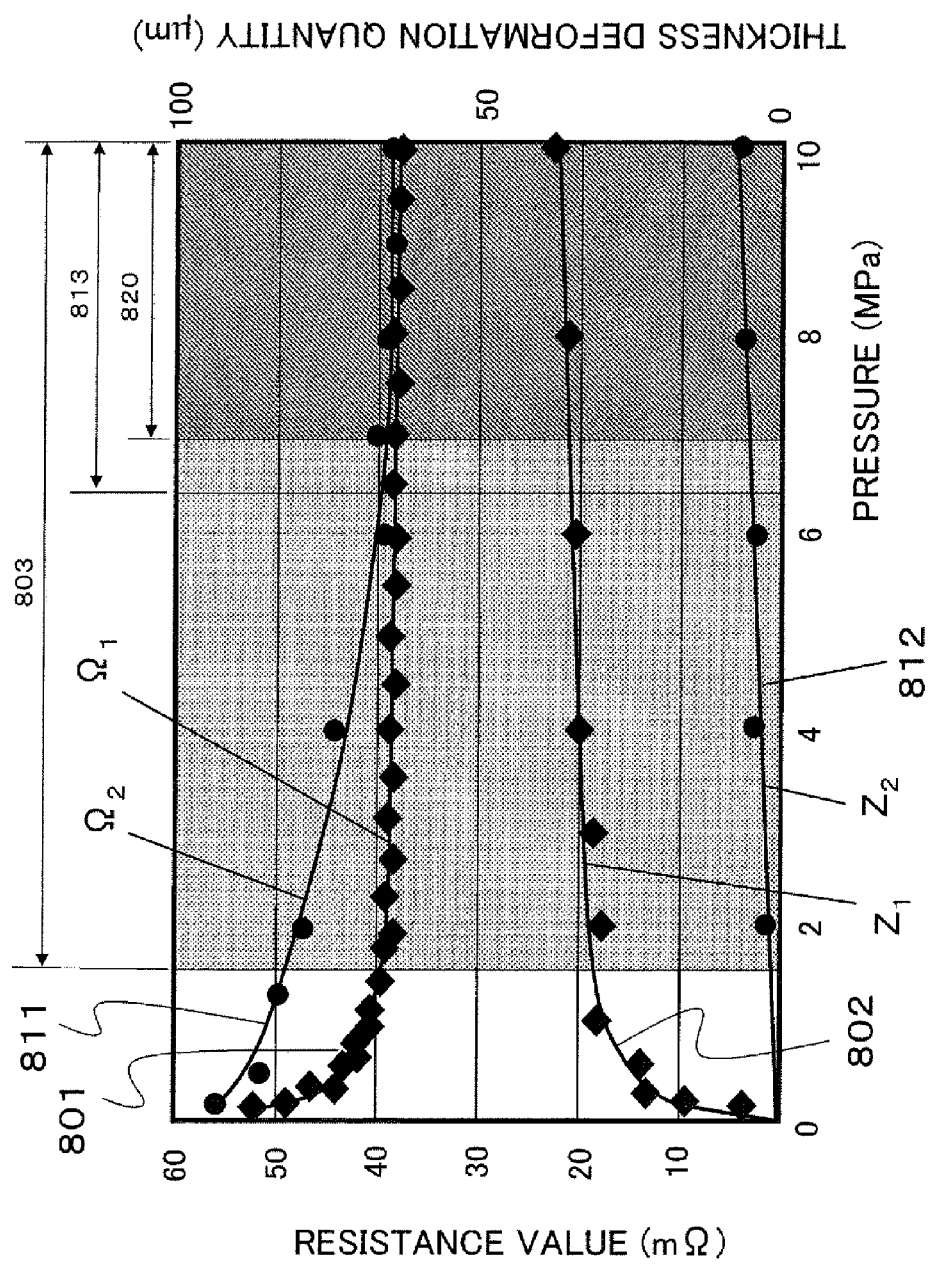
FIG. 8 shows a correlation between the applied pressure and the connection resistance value between the electrode of the power semiconductor element and the lead frame, and a correlation between the applied pressure and the deformation quantity in the thickness direction of the porous nickel plating layer, with respect to the pressed-contact type power semiconductor device as an example of the present invention, and shows, a correlation of the applied pressure and the connection resistance value between the electrode of the power semiconductor element and the lead frame, and a correlation of the applied pressure and the deformation quantity in the thickness direction of the soft metallic sheet, with respect to a pressed-contact type power semiconductor device as a comparative example.

Next, mainly referring to FIGS. 7(a), 7(b), and 8, a pressed-contact type power semiconductor device which is one example of the pressed-contact type semiconductor device of the present invention is described more concretely.

By the way, the components that are the same as those of the above described embodiment are denoted by the same reference numerals.

FIG. 7(a) is a schematic sectional view of a pressed-contact type power semiconductor device of the present example. The pressed-contact type power semiconductor device shown in FIG. 7(a) is one example of the configuration which is shown in FIG. 5(c) and described in the above embodiment.

FIG. 7(b) is a schematic sectional view of a pressed-contact type power semiconductor device as a comparative example in which the conventional soft metal sheet 103 is used. Since the pressed-contact type power semiconductor device shown in FIG. 7(b) fundamentally has the same configuration as the conventional pressed-contact type power semiconductor device described by using FIG. 10 has, the same reference numerals are attached.

In the pressed-contact type power semiconductor device of the present example, the lead frame 2 and the lead frame 4 are constituted by copper with thickness of 1.5 mm. As one example of the metallic porous plating layer 3 described in the above embodiment, a porous nickel plating layer 15 with a porosity of 50% and a thickness of 100 μm is applied to the surface of the lead frame 2 on the side which faces the lower electrode 19 of the power semiconductor element 1.

As shown in FIG. 7(a), the lower electrode 19 and the upper electrode 18 with thickness of 400 μm of the power semiconductor element 1, and the lead frame 2 and the lead frame 4 are joined by pressed contact with the configuration in which the applied pressure A is always applied. At this time, the porous nickel plating layer 15, which comes in contact with the lower electrode 19 of the power semiconductor element 1, is deformed by the applied pressure A in the pressed-contact direction with a quantity of $Z_1$.

It is desirable that the deformation quantity $Z_1$ be 10% or more and 70% or less with respect to the thickness of the formed porous nickel plating layer 15 before the deformation, when the absorbency of the variation of the components which constitute the pressed-contact type power semiconductor device and the stability of the connection resistance value are taken into consideration.

For example, when the deformation quantity $Z_1$ of the porous nickel plating layer 15 which is formed with thickness of 100 μm is 10% or less, the numerical value is 10 μm or less. As shown in FIG. 9, in the case where the power semiconductor device is constituted by using the components with a general tolerance, there is an example in which gaps K and L of 10 μm or more occur. When the occurrence of the gaps is taken into consideration, for such a deformation quantity, the effect of the absorption of the gaps K and L is small, and it is difficult to obtain the uniform pressed-contact force in a surface.

When the deformation quantity $Z_1$ exceeds 70%, since, in the pressurization state, the deformation of the porous nickel plating layer 15 takes place in a plastic deformation region, it becomes impossible to obtain sufficient reaction force with respect to the pressure direction at the contact between the electrode of the power semiconductor element and the metallic porous plating layer. And as a result, the connection resistance value may become unstable in long-term reliability.

FIG. 8 shows a correlation between the applied pressure A and the connection resistance value $\Omega_1$ between the lower electrode 19 of the power semiconductor element 1 and the lead frame 2, and a correlation between the applied pressure A and the deformation quantity $Z_1$ in the thickness direction of the porous nickel plating layer 15. In FIG. 8, a solid line 801 indicates the change of the connection resistance value $\Omega_1$ of the present example, and a solid line 802 indicates the change of thickness deformation quantity $Z_1$ (pressed-contact direction) of the porous nickel plating layer 15.

Figure 11:
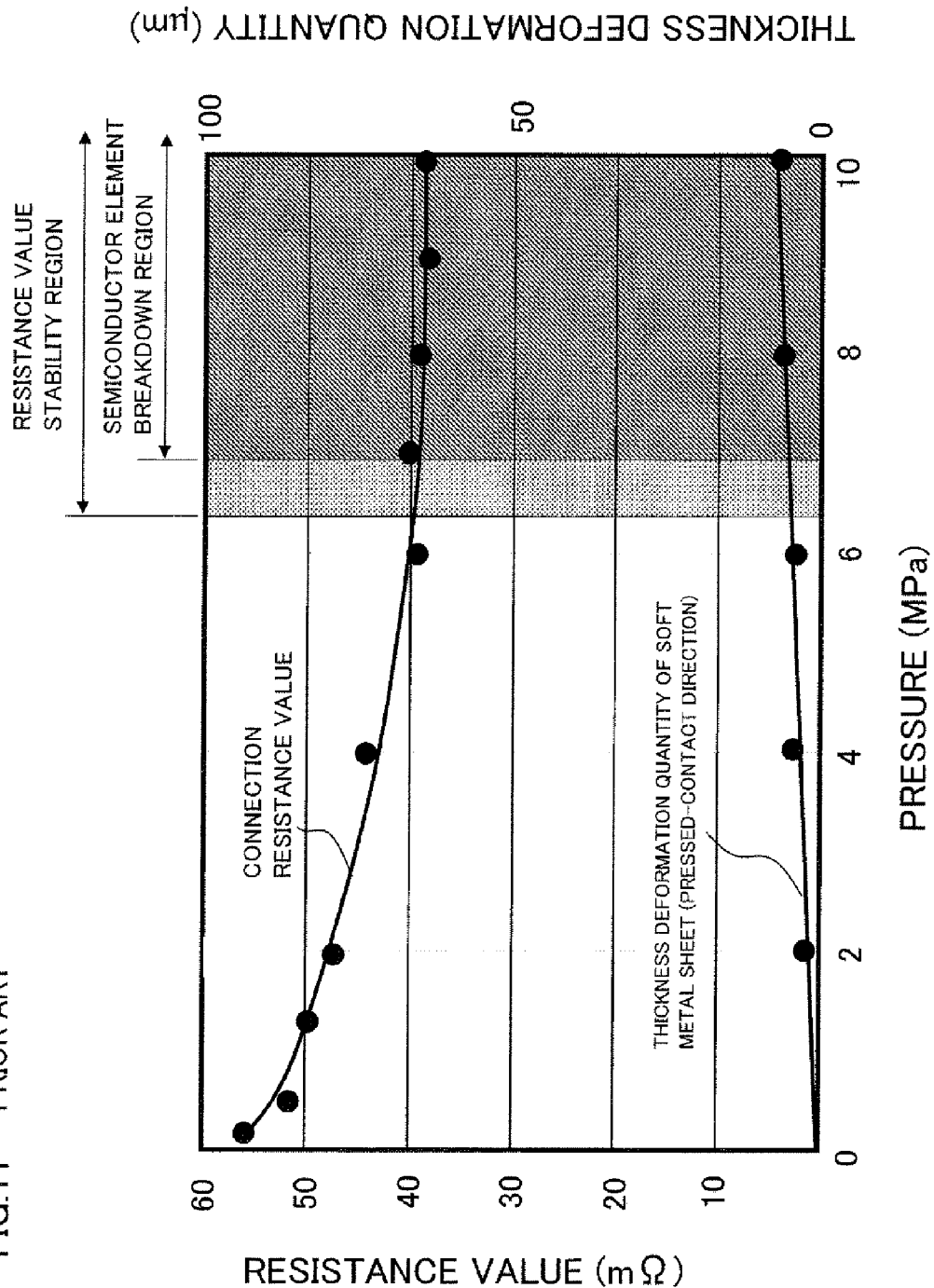
FIG. 11 shows a correlation of the applied pressure and the connection resistance value between the electrode of the power semiconductor element and the lead frame, and a correlation of the applied pressure and the quantity of deformation in the thickness direction of the soft metal sheet with respect to the conventional pressed-contact type power semiconductor device.

By the way, in FIG. 8, the estimated result (see FIG. 11) with the conventional soft metal sheet 103 shown in FIG. 7(b) is also indicated on the same graph. That is, in FIG. 8, a solid line 811 indicates the change of the connection resistance value $\Omega_2$ between the lower electrode 106 of the power semiconductor element 101 as a comparative example and the lead frame 102, and a solid line 812 indicates the change of the thickness deformation quantity $Z_2$ (pressed-contact direction) of the soft metal sheet 103.

Here, the thickness of the soft metal sheet 103 shown in FIG. 7(b) is 100 µm, the thickness of each of the lower electrode 106 and the upper electrode 105 of the power semiconductor element 101 is 400 µm, and the thickness of each of the lead frame 102 and the lead frame 104 is 1.5 mm.

The size of the conventional pressed-contact type power semiconductor element 101 as a comparative example is the same as that of the pressed-contact type power semiconductor element 1 of the present example.

FIG. 8 shows, in the case of the pressed-contact type power semiconductor device of the present example shown in FIG. 7(a), that, in a low load region of 0 MPa to 1.7 MPa, the increase of the deformation quantity $Z_1$ is remarkable (see reference numeral 802 in FIG. 8), and that the connection resistance value $\Omega_1$ tends to decrease along with it (see reference numeral 801 in FIG. 8), and is stabilized in a region of 1.7 MPa to 10 MPa (see the resistance value stability region 803 of the example in FIG. 8).

A region of 7 MPa or more is a region which cannot be used as a product, because the power semiconductor element 1 tends to break down (see the semiconductor element breakdown region 820 in FIG. 8). Therefore, a stability region of the connection resistance value $\Omega_1$ which can be practically used as a product is 1.7 MPa to 7 MPa, and the deformation quantity $Z_1$ in that range is approximately 30 µm, which is approximately 30% of the initial thickness.

On the other hand, in the case of the conventional pressed-contact type power semiconductor device as a comparative example, a deformation quantity $Z_2$ of the thickness of the soft metal sheet 103 along with the increase in pressure is small (see reference numeral 812 in FIG. 8), it is impossible to obtain the stable connection resistance value $\Omega_2$ except for the neighborhood of 6.5 MPa (see the resistance value stability region 813 of the comparative example in FIG. 8) which is close to a breakdown region of the power semiconductor element 101 (see the semiconductor element breakdown region 820 in FIG. 8).

Specifically, in the case of the pressure of 6.5 MPa, the deformation quantity of the thickness of the soft metal sheet 103 is about 6 µm. In the case where the pressed-contact type power semiconductor device is constructed by using the components with a general tolerance, there is an example in which the gap of 10 µm or more occurs between the lower electrode 106 of the power semiconductor element 101 and the lead frame 102. When such an occurrence of the gap is taken into consideration, it can be said that this value is insufficient as a deformation quantity.

According to the result shown in FIG. 8, in the case of the porous nickel plating layer 15, where larger deformation is obtained by applying smaller pressure as compared with the conventional pressed-contact type semiconductor device, it can be said that the effect of absorbing the variation of the various components of the pressed-contact type power semiconductor device to obtain the stable connection resistance value $\Omega_1$ is large.

In the case of the configuration in which the conventional soft metal sheet 103 shown in FIG. 7(b) is used, when excessive pressure is applied in order to obtain the uniform surface contact, due to the change from the elastic deformation region to the plastic deformation region for the soft metal sheet 103, it becomes impossible to obtain sufficient reaction force from the soft metal sheet 103 with respect to the pressure direction A at the contact between the lower electrode 106 of the power semiconductor element 101 and the soft metal sheet 103, and the contact between the lead frame 102 and the soft metal sheet 103. Therefore, even if the initial connection resistance value is good, the connection resistance value becomes unstable in long-term reliability, and as a result, there has been a problem that the characteristic of the power semiconductor device may not be stabilized.

On the contrary, in the case of the configuration shown in FIG. 7(a) of the present example, as described above, when the deformation quantity $Z_1$ in the thickness direction of the porous nickel plating layer 15 is 70% or less, the elastic deformation region is maintained. As shown in FIG. 8, since a good connection resistance value $\Omega_1$ can be obtained with a deformation quantity $Z_1$ of about 30%, at this time, it is also possible to obtain sufficient reaction force with respect to the pressure direction. And as a result, it is possible to maintain the stable connection resistance value also in long-term reliability, and it becomes possible to obtain a pressed-contact type power semiconductor device having a superior characteristic.

By the way, in the above described embodiment, the pressed-contact type power semiconductor device as a pressed-contact type semiconductor device is described. However, the present invention is not limited to this and, for instance, a pressed-contact type semiconductor device using a usual semiconductor element also may be utilized. In such a case, the same effect as the above arises.

As described above, the pressed-contact type power semiconductor device which is one example of the present invention can absorb the dimensional variation of the various components, such as the thickness of the lead frame and the thickness of the heat radiation plate, which constitute the pressed-contact type power semiconductor device, and can obtain the stable connection resistance value with small pressure. And by the method for manufacturing a pressed-contact type power semiconductor device which is one example of the present invention, the pressed-contact type semiconductor device having a good characteristic can be fabricated.

INDUSTRIAL APPLICABILITY

The pressed-contact type semiconductor device and the method for manufacturing the same according to the present invention have an effect of absorbing the dimensional variation of the various components, which constitute the pressed-contact type semiconductor device to obtain the stable connection resistance value with a pressure that is smaller as compared with the conventional pressed-contact type semiconductor device, and can provide an inverter substrate with a good characteristic for a motor of an electric vehicle, a power conditioner of a power generation system used indoors or outdoors, and the like, and then, can be used in the field of a car, environment, a residence, and an infrastructure.

DESCRIPTION OF SYMBOLS

1 Power semiconductor element
2 Lead frame
3 Metallic porous plating layer
4 Lead frame
5 Pore
6 Heat radiation plate
7 Insulating layer
8 Lead frame
9 Lead frame
10 Lead frame
11 Mask
12 Plating layer
13 Metallic porous plating layer
15 Porous nickel plating layer
16 Heat radiation plate
17 Insulating layer
18 Upper electrode
19 Lower electrode
21 Power semiconductor element
22 Metallic porous plating layer
23 Metallic porous plating layer
24 Metallic porous plating layer
25 Source electrode
26 Emitter electrode
27 Gate electrode
28 Clip
101 Power semiconductor element
102 Lead frame
103 Soft metal sheet
104 Lead frame
105 Upper electrode
106 Lower electrode

What is claimed:

1. A method for manufacturing a pressed-contact type semiconductor device which has a semiconductor element, on an upper surface of which at least a first electrode is formed and on a lower surface of which at least a second electrode is formed, and a pair of lead frame members which face the first electrode and the second electrode of the semiconductor element respectively comprising:
    forming a metallic porous plating layer on a surface of at least one of the lead frame members, the metallic porous plating layer having a plurality of pores formed such that at least some of the plurality of pores are surrounded on all sides by metal of the metallic porous plating layer, the surface being to face the first electrode or the second electrode of the semiconductor element; and
    joining the metallic porous plating layer to the first electrode or the second electrode of the semiconductor element by a pressed contact, the first electrode or the second electrode being made to face the metallic porous plating layer; wherein
    a pore of the metallic porous plating layer has a shape in which a length in a pressed-contact direction is longer than a length in a direction that is perpendicular to the pressed-contact direction.

2. The method for manufacturing a pressed-contact type semiconductor device according to claim 1, wherein
    a thickness of the metallic porous plating layer is 10 μm or more and 200 μm or less and a porosity of the metallic porous plating layer is 20% or more and 70% or less.

3. The method for manufacturing a pressed-contact type semiconductor device according to claim 1, wherein
    a thickness of the metallic porous plating layer is 10 μm or more and 200 μm or less and a porosity of the metallic porous plating layer is 20% or more and 70% or less.

4. The method for manufacturing a pressed-contact type semiconductor device according to claim 1, wherein
    the metallic porous plating layer is formed on the surface of the at least one of the lead frame members by electroplating.

5. A pressed-contact type semiconductor device comprising:
    a semiconductor element, on an upper surface of which at least a first electrode is formed and on a lower surface of which at least a second electrode is formed;
    a pair of lead frame members which face the first electrode and the second electrode of the semiconductor element respectively; and
    a pressure applying member which applies a pressure to the pair of lead frame members while the semiconductor element is sandwiched by the pair of lead frame members,
    wherein a metallic porous plating part is formed on a surface which faces the first electrode or the second electrode, the surface being a surface of at least one of the lead frame members; wherein
    a pore of the metallic porous plating part has a shape in which a length in a pressed-contact direction is longer than a length in a direction that is perpendicular to the pressed-contact direction.

6. The pressed-contact type semiconductor device according to claim 5, wherein
    the pressure which is applied by the pressure applying member is less than a pressure which changes the metallic porous plating part into a plastic region from an elastic region.

7. The pressed-contact type semiconductor device according to claim 5, wherein
    the pressure which is applied by the pressure applying member is less than a pressure which destroys the semiconductor element.

8. The pressed-contact type semiconductor device according to claim 5, wherein
    the metallic porous plating part is formed by a nickel porous plating.

* * * * *